United States Patent [19]

Honess et al.

[11] Patent Number: 5,126,669
[45] Date of Patent: Jun. 30, 1992

[54] PRECISION MEASUREMENT OF MAGNETIC CHARACTERISTICS OF AN ARTICLE WITH NULLIFICATION OF EXTERNAL MAGNETIC FIELDS

[75] Inventors: Shawn B. Honess, Portland, Oreg.; Pablo Narvaez, Los Angeles; James M. McAuley, Altadena, both of Calif.

[73] Assignee: The United States of America as represented by the Administrator, of the National Aeronautics and Space Administration, Washington, D.C.

[21] Appl. No.: 618,789

[22] Filed: Nov. 27, 1990

[51] Int. Cl.⁵ .................. G01N 27/72; G01R 33/025; G01R 33/038; G01R 33/12

[52] U.S. Cl. .................. 324/261; 324/244; 324/205; 361/148; 361/149; 361/267

[58] Field of Search .................. 324/202, 205, 207.25, 324/234, 225, 226, 227, 244, 247, 260–262, 232, 377; 361/146–149, 267

[56] References Cited

U.S. PATENT DOCUMENTS

| | | | |
|---|---|---|---|
| 2,427,666 | 9/1947 | Felch, Jr. et al. | 175/183 |
| 2,504,778 | 4/1950 | Young | 324/262 |
| 3,183,434 | 5/1965 | Auer | 324/377 |
| 3,389,333 | 6/1968 | Wolff et al. | 361/146 |
| 3,397,586 | 8/1968 | Crook | 74/96 |
| 3,432,751 | 3/1969 | Godby et al. | 324/43 |
| 3,665,296 | 5/1972 | Gross et al. | 324/34 S |
| 3,801,877 | 4/1974 | Griese et al. | 361/146 |
| 3,820,012 | 6/1974 | Molyneux | 324/377 |
| 3,879,658 | 4/1975 | Hummel | 324/36 |
| 3,890,565 | 6/1975 | Obenschain | 324/43 R |
| 4,109,199 | 8/1976 | Ball et al. | 324/202 |
| 4,229,696 | 10/1980 | Gustafson | 324/207 |
| 4,277,750 | 7/1981 | Bonnet et al. | 324/201 |
| 4,362,992 | 12/1982 | Young et al. | 324/247 |
| 4,439,732 | 3/1984 | Hesterman et al. | 324/247 |
| 4,463,314 | 7/1984 | Wilson | 324/244 |
| 4,492,923 | 1/1985 | Byram | 324/207 |
| 4,638,447 | 1/1987 | Odeh | 364/556 |
| 4,648,041 | 3/1987 | Tarr | 364/481 |
| 4,649,495 | 3/1987 | Cagan et al. | 364/481 |
| 4,734,643 | 3/1988 | Babenik et al. | 324/232 |
| 4,767,988 | 8/1988 | Wilson | 324/247 |
| 4,788,504 | 11/1988 | Blanpain et al. | 324/261 X |
| 4,845,429 | 7/1989 | Burreson | 324/234 |
| 4,904,940 | 2/1990 | Rempt | 324/244 |

Primary Examiner—Kenneth A. Wider
Assistant Examiner—Warren S. Edmonds
Attorney, Agent, or Firm—Thomas H. Jones; John R. Manning; Guy M. Miller

[57] ABSTRACT

Apparatus for characterizing the magnetic field of a device under test includes a device for nullifying the ambient magnetic field in a test environment area with a constant applied magnetic field, a device for rotating the device under test in the test environment area at least nearly through a complete circle, a device for sensing the magnetic field at a sensor location which is along the circumference of rotation as a function of the rotation angle for successive ones of a set of predetermined orientations of the device under test to obtain a profile of the magnetic field at the sensor location as a function of the rotation angle for each one of the predetermined orientations, a memory for storing the profiles, and a processor coupled to the memory for characterizing the magnetic field of the device from the magnetic field profiles thus obtained.

18 Claims, 5 Drawing Sheets

PRECISION MEASUREMENT OF MAGNETIC CHARACTERISTICS OF AN ARTICLE WITH NULLIFICATION OF EXTERNAL MAGNETIC FIELDS

ORIGIN OF THE INVENTION

The invention described herein was made in the performance of work under a NASA contract, and is subject to the provisions of Public Law 96-517 (35 USC 202) in which the Contractor has elected not to retain title.

BACKGROUND OF THE INVENTION

1. Technical Field

The invention is related to the fabrication of vehicles such as spacecraft having on board extremely sensitive magnetometer experiments for sensing distant magnetic fields whose measurements are susceptible of being distorted by local magnetic fields of components comprised within the spacecraft. More specifically, the invention is concerned with ways of fabricating such spacecraft in such a way as to at least nearly eliminate such local magnetic fields of the individual components on board the craft.

2. Background Art

Measuring distant magnetic fields in an exploratory vehicle such as a spacecraft or satellite requires a sensitive magnetometer on board the craft. The problem is that a magnetometer sufficiently sensitive to measure distant magnetic fields (of other planets comets or asteroids, for example) is sensitive to local magnetic fields as well. Various components aboard the spacecraft (such as communication equipment, on-board experimental apparatus, guidance and navigation hardware and the like) can have current-generated magnetic moments, serving as local magnetic field sources. Such local field sources distort the measurements of distant magnetic fields by the magnetometer.

One solution has been to estimate the various local fields surrounding the magnetometer and compensate for them in processing the measurement data generated by the magnetometer. However, such a solution is fraught with uncertainties, not the least of which is the uncertainty involved in measuring or estimating the local magnetic field produced by a given component aboard the spacecraft. It would be much more desireable to measure distant magnetic fields with the magnetometer in the absence of local magnetic fields, thereby avoiding the necessity of having to "back-out" their distortions in the magnetometer data. However, this has not seemed possible because the components required to control a spacecraft necessarily have their own magnetic moments.

Accordingly, it is an object of the invention to provide a way of quickly and accurately measuring the magnetic field of each individual component to be placed in the spacecraft.

It is a further object of the invention to provide a way of nullifying the magnetic field of each component so that, when placed on the spacecraft, it will not disturb the on-board magnetometer.

It is another object of the invention to provide a way of quickly measuring the magnetic field in three dimensions of each component to be placed on a spacecraft, permanently nullifying the component's magnetic field and then re-measuring the component's magnetic field to confirm that it has been effectively nullified.

It is a still further object of the invention to assemble a spacecraft almost entirely of individual components whose magnetic fields have been thus measured and permanently nullified.

DISCLOSURE OF THE INVENTION

The invention is a method for characterizing the magnetic field of a device under test, whose steps are nullifying the earth's magnetic field in a test environment area, placing the device under test in the test environment area, rotating the device under test in the test environment area through a complete circle, sensing and recording the magnetic field at a point along the circumference of rotation of the device as a function of the angle of rotation of the device, re-orienting the device to one of a set of predetermined orientations and repeating the rotating and sensing steps, so as to obtain a profile of the magnetic field for each one of the predetermined orientations, and characterizing the magnetic field of said device from the magnetic field profiles obtained for the set of orientations. In one embodiment, the set of orientations are the three orthogonal orientations of said device. In another embodiment, the set of orientations are a set of m rotations of the device about an axis normal to the axis about which the rotating step rotates the device, where by to provide magnetic field profiles of said device along m great circles. In this latter embodiment, the characterizing step solves Laplace's equation for a magnetic potential along said m great circles simultaneously.

The invention is also a method for fabricating and assembling magnetic free components, in which the foregoing steps are followed by the following steps for nullifying the magnetic field of the device under test: determining from the characterizing step the field strength and particular orientation of a permanent magnet to be attached to the device so as to nullify the magnetic field of said device, and attaching a permanent magnet having the appropriate field strength to the device in accordance with the particular orientation, whereby to produce a device having virtually no magnetic field at a particular distance.

BRIEF DESCRIPTION OF THE DRAWINGS

The invention is described in detail below with reference to the accompanying drawings, of which.

MODES FOR CARRYING OUT THE INVENTION

Figure 1:
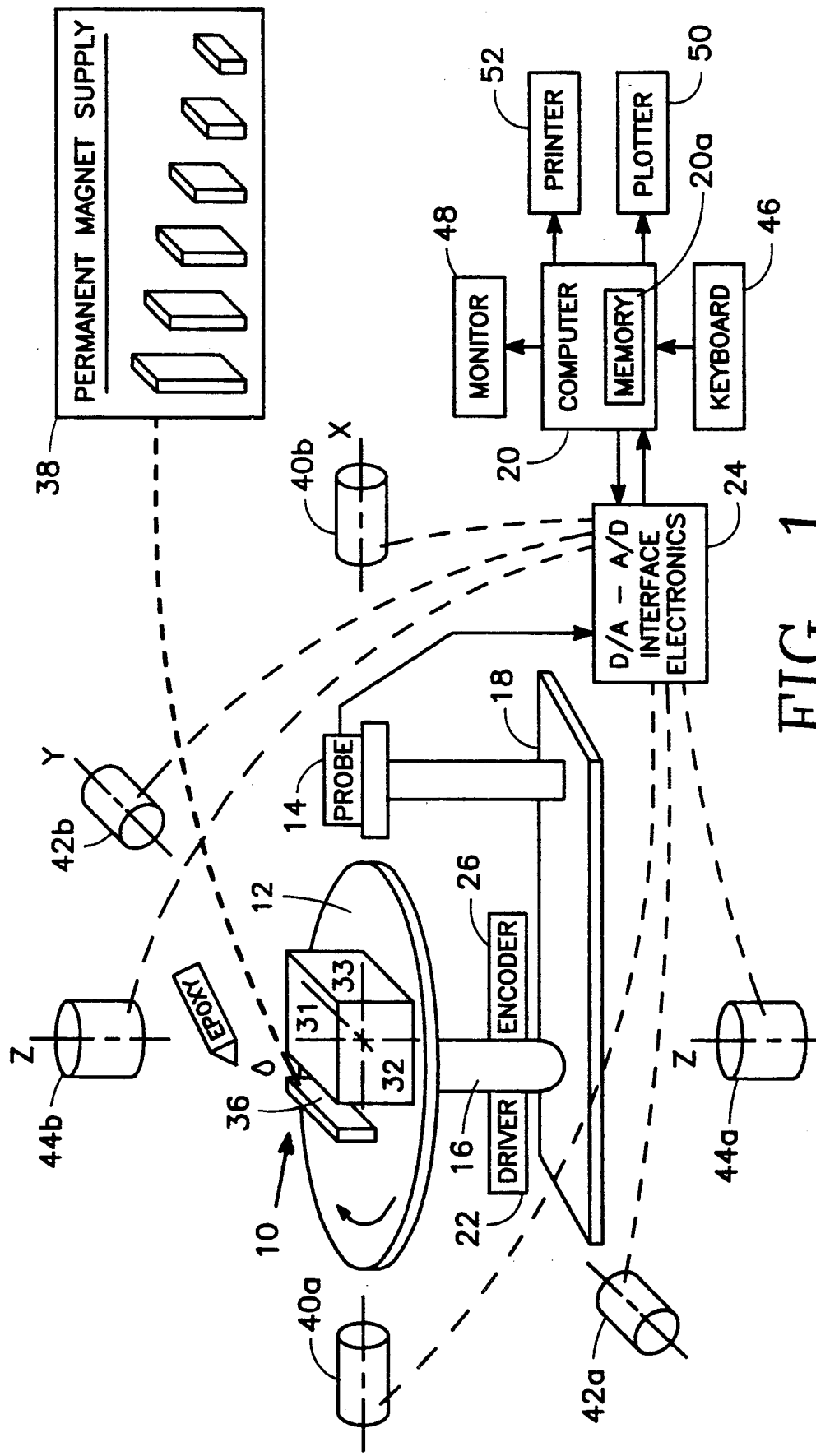
FIG. 1 is a simplified diagram of apparatus embodying the invention.

Referring to FIG. 1, a turn table 10 rotates a device under test 12 with respect to a single axis magnetic probe 14. The device under test is typically a component of a spacecraft. The axle 16 of the turn table 10 and the probe 14 are stabilized on a stationary platform 18. A computer 20 controls a driver motor 22 connected to the turn table axle 16 through interface electronics 24. The computer 20 senses through the interface electronics a turn table position signal generated by an optical shaft encoder 26 on the turn table axle 16. The computer 20 also senses through the interface electronics 24 the output of the magnetic probe 14. As the turn table 10 rotates the device under test 12 through 360 degrees, the computer 20 stores in its memory 20a a profile of the output of the magnetic probe as a function of angular position of the device (as sensed by the shaft encoder 26).

In order to map the three-dimensional magnetic field of the device under test 12, computer 20 obtains a profile of the magnetic probe output for each one of three orthogonal orientations of the device 12, for a total of three profiles. Thus, one profile of the magnetic probe output is obtained by the computer 20 over a 360 degree rotation of the table 10 with the face 31 of the device 12 facing "up". Then, the device 12 is re-oriented by 90 degrees and the same step is repeated with the face 32 of the device 12 facing "up". Finally, the device 12 is again re-oriented and the same step is repeated with the face 33 of the device 12 facing "up".

Having stored the three profiles of the magnetic probe output in its memory 20a, the computer 20 then determines from the stored data the magnetic field direction and strength of the device 12.

The next step is to nullify the magnetic field of the device 12. For this purpose, a permanent magnet 36 is selected from a collection 38 of permanent magnets of different field strengths or the magnet can be manufactured in real-time to the specified field strength. In accordance with the invention, the selected magnet 36 has a field strength equal to that of the device 12. The selected magnet 36 is mounted with epoxy on the surface of the device 12 at an orientation such that its field points in a direction exactly opposite to that of the magnetic field of the device (as determined by the computer 20). The field of the permanent magnet is thus equal and opposite to the field of the device, nullifying the device field. In this manner, a majority of the components to be placed aboard a spacecraft can be manufactured so as to be free of magnetic fields. An entire spacecraft can be manufactured of components which have had their intrinsic magnetic fields nullified in the foregoing manner.

In order to avoid mischaracterizing the magnetic field of the device under test 12 due to the presence of the earth's magnetic field (or any other stationary magnetic field source), the environment of the device under test 12 must be free of any external magnetic fields. For this purpose, Helmholtz coils 40, 42, 44 are place along three orthogonal axes (labeled X, Y and Z in FIG., centered at the device 12. The Helmholtz coils 40, 42, 44 consist of pairs of windings 40a, 40b; 42a,42b; 44a, 44b lying along a respective one of the X, Y and Z axes and disposed symmetrically with respect to the geometric center of the device under test 12. The computer 20 sets and maintains the current in each one of the windings so as to precisely nullify the earth's magnetic field (and any other stationary magnetic field sources) in the region of the device under test 12.

Preferably, the computer 20 is connected to a keyboard 46 to provide manual operator control, to a monitor 48 for enabling the operator to follow the actions of the computer 20 and to a plotter 50 and printer 52 which generate graphs and documents memorializing the results of the magnetic field measurements performed by the apparatus of FIG. 1. In the preferred embodiment, the computer 20 provides the operator with a pop-up menu windows environment on the monitor 48 which enables the operator to easily select various operations to be performed by the apparatus of FIG. 1, such as nullifying the earth's magnetic field or performing magnetic mapping of the device under test 12 or determining the magnetic field of the device under test by analyzing the three-dimensional profile of the output of the magnetic probe 14 obtained during magnetic mapping.

Figure 2:
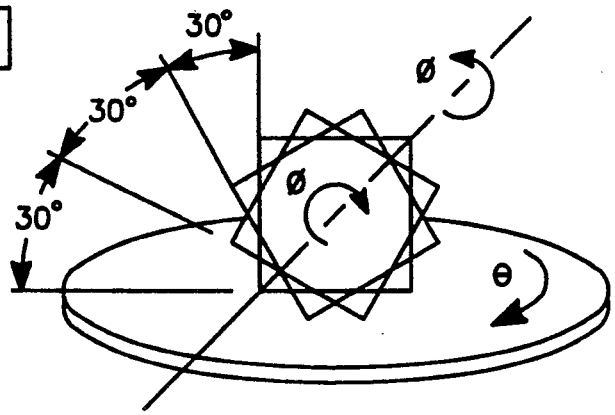
FIG. 2 is a diagram of a series of positions with respect to a magnetic probe of a device under test whose magnetic field is to be characterized by the apparatus of FIG. 1.

In the preferred embodiment of the invention, a more accurate near-field measurement of the device under test 12 is performed by obtaining the profile of the magnetic probe output for a 360 degree rotation of the device under test 12 for each one of 6 (or more) acute orientations of the device under test, as illustrated in FIG. 2. In the embodiment of FIG. 2, each acute orientation of the device under test 12 is achieved by rotating the device 12 by 30 degrees about the Y axis to the new orientation. Upon each 30 degree rotation of the device 12 about the Y axis, the device 12 is held stationary on the turn table 10 and the turn table 10 is then rotated about the Z axis 360 degrees while the computer 20 records the profile of the magnetic probe output as a function of the angular position about the Z axis. The foregoing is repeated for each one of six orientations of the device 12 displaced by 30 degrees about the Y axis. The six orientations are labelled in FIG. 3 as A, B, C, D, E and F. Thus, the computer 20 records a total of six profiles of the magnetic probe output. As will be described below, the computer 20 computes from the six magnetic probe profiles the magnetic dipole moment of the device under test with greater precision than that achieved in the magnetic mapping process described hereinabove with reference to FIG. 1.

Figure 4:
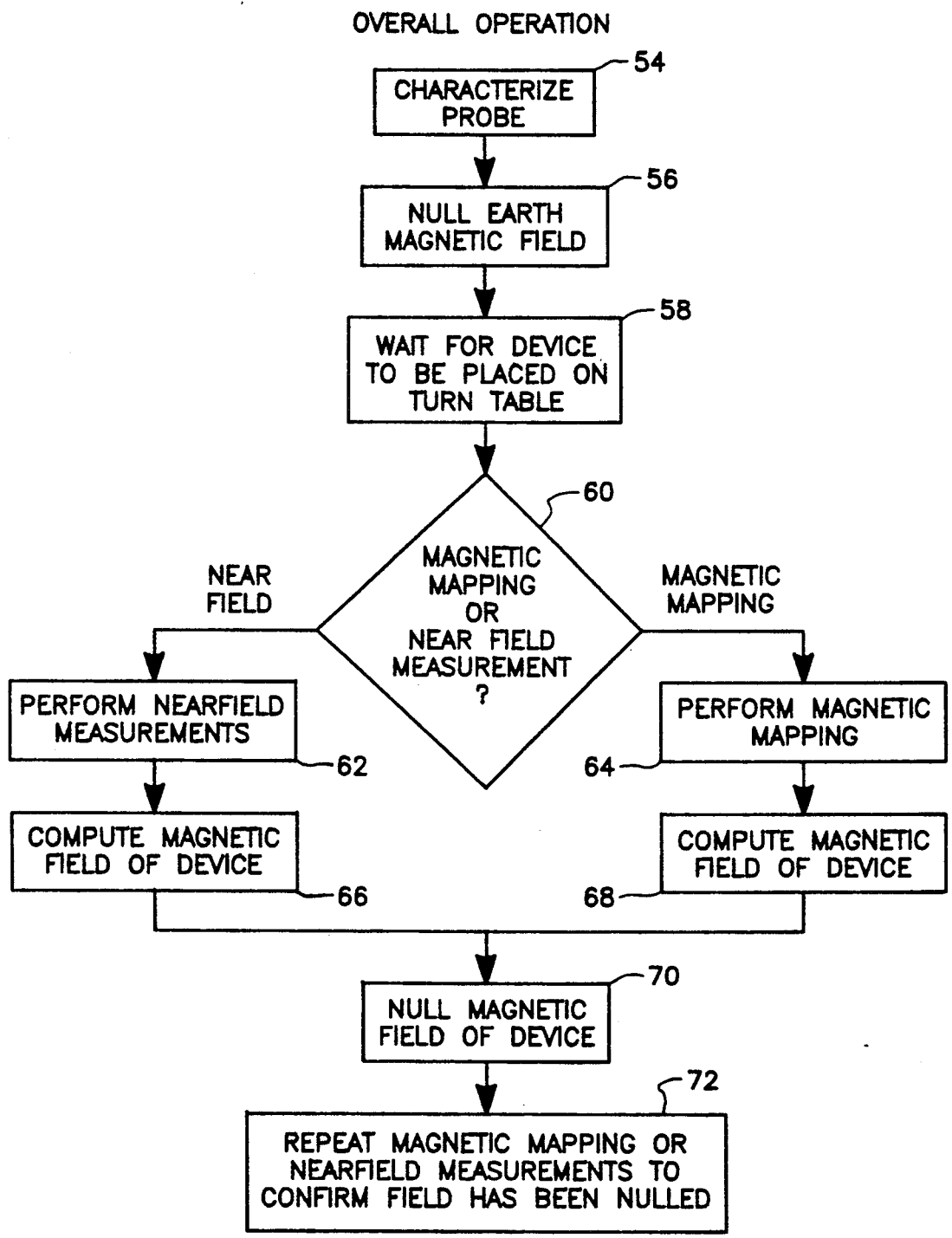
FIG. 4 is a flow diagram of the overall operation of the computer in the apparatus of FIG. 1.

FIG. 4 illustrates the overall operation of the computer 20. In step 54 of FIG. 4, the computer 20 characterizes the magnetic probe 14 so that it can translate the output signal from the interface electronics 24 stimulated by the magnetic probe 14 into a magnetic field strength in appropriate units (such as nano-Teslas, for example). In the preferred embodiment, the computer memory 20a stores a set of look-up tables characterizing each of many common magnetic probes by part number or name. In the probe characterization step 54, the computer displays a request to have the operator enter the probe part number or name (or both) on the keyboard 46, and the computer 20 then determines the appropriate scaling factor and units to be applied to the output of the magnetic probe 14 received through the interface electronics 24.

The next step in the process of FIG. 4 is to null the earth's magnetic field (step 56 of FIG. 4). In this step, the device under test 12 is removed from the turn table 10 and a magnetic probe is placed at the center or origin of the X-Y-Z axes. In one embodiment, this is accomplished by simply moving the magnetic probe 14 to the center of the turn table 12. The probe 14 is a single axis magnetic probe. First, the probe 14 is aligned parallel with the X axis and the computer 20 samples the probe output and computes the magnetic field strength along the X axis. From the computed X axis magnetic field strength, the computer 20 determines in a straightforward manner the direction and magnitude of the current in the X axis Helmholtz coils 40a, 40b required to nullify the X axis measured field. The probe 14, still located at the origin of the X-Y-Z axes or center of the turn table 10, is then aligned parallel with the Y axis and the foregoing process is repeated to determine the required current flow in the Y axis Helmholtz coils 42a, 42b to nullify the Y axis magnetic field. The same process is repeated to determine the required current in the Z axis Helmholtz coils 44a, 44b. The computer 20 then causes the interface electronics 24 to generate and maintain the required current flow in each of the Helmholtz coils in accordance with the foregoing determination.

The next step (step 58 of FIG. 4) is for the computer to notify the operator via the monitor 48 that the earth magnetic field nullification process is complete so that the apparatus is ready for a device under test to be placed at the center of the turn table 10. The computer 20 offers a menu on the display 48 which enables the operator to choose between the magnetic mapping process or the near field measurement process (step 60 of FIG. 4).

The computer then performs the magnetic mapping process (step 62) or the near field measurement process (step 64) depending upon the choice entered by the operator in step 60. Each of the mapping or measurement steps 62, 64 is followed by a unique analysis step (steps 66 and 68 respectively) in which the computer 20 determines from the magnetic probe profile data the magnetic field of the device under test. The analysis steps 66 and 68 are each performed in a different manner. The result of either one of the analysis steps 66 and 68 is that the computer 20 provides the operator with the magnitude of the magnetic field of the device under test along each of the X, Y and Z axes for a particular orientation of the device 12.

The next step (step 70 of FIG. 4) is to null the magnetic field of the device under test 12. This may be done in either one of two ways. In the preferred embodiment, the device field is nulled permanently by attaching a permanent magnet to the device, the permanent magnet being aligned in the direction of the device field and having a permanent field equal in magnitude to the device field. In another embodiment, the computer 20 alters the current in the Helmholtz coils 40, 42, 44 so as to temporarily null the magnetic field of the device 12, for analytical purposes.

In the preferred embodiment, the computer 20 determines and in a straightforward manner how to orient the permanent magnet and where it should be attached to the device under test 12 for a maximum effective cancellation. The computer 20 displays the desired orientation of the permanent magnet to be attached to the device 12, the X, Y and Z coordinate of where it should be attached and the required field strength of the permanent magnet 36 (see FIG. 1). After the operator has successfully attached the appropriate permanent magnet 36 to the device 12, the computer 20 can perform the final step.

The final step (step 72 of FIG. 4) is to repeat the previous measurement and field determination steps (either steps 62 and 66 or steps 64 and 68) to confirm that the device field has indeed been effectively nulled.

Figure 5:
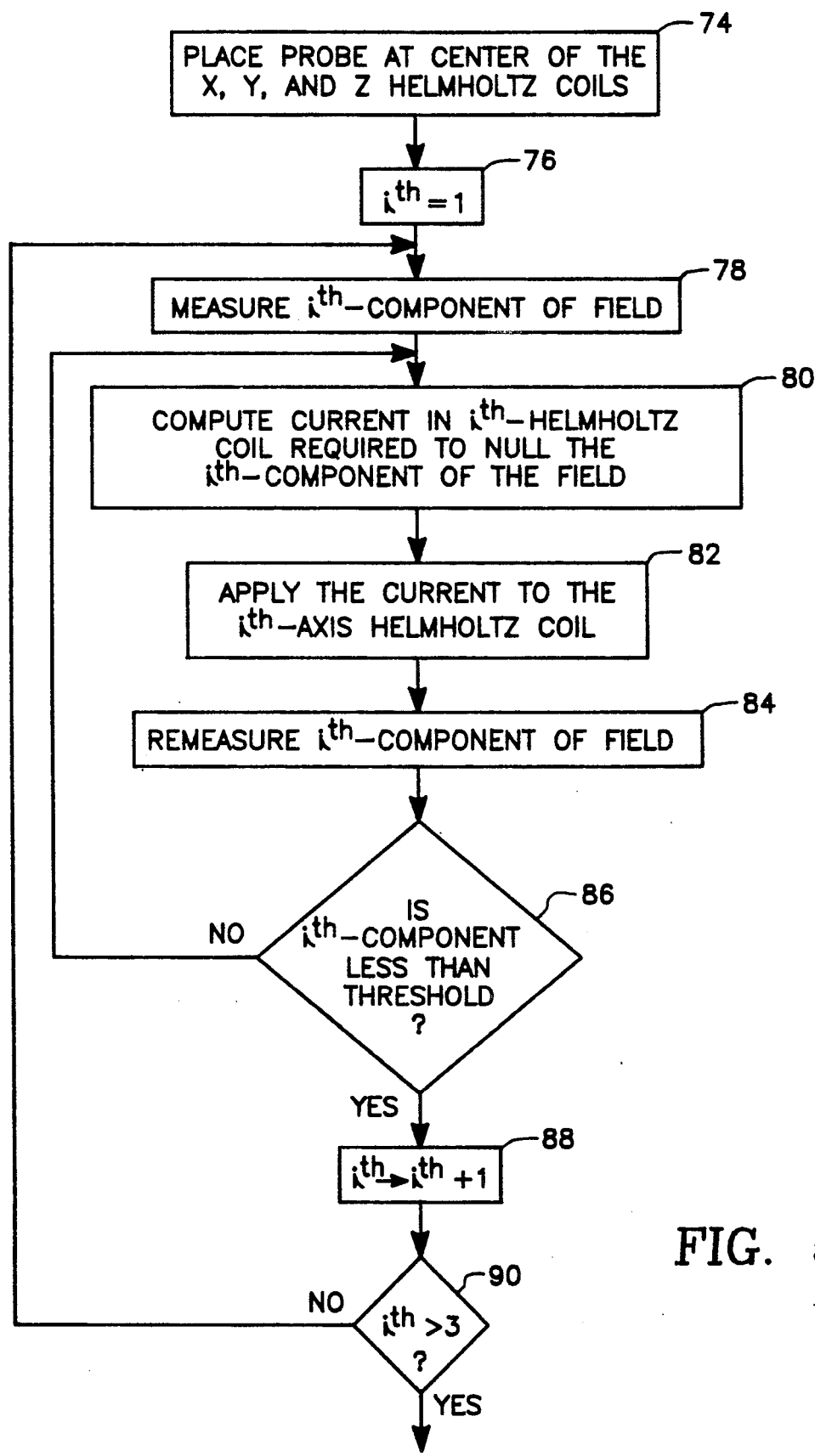
FIG. 5 is a flow diagram of one aspect of the computer operation of FIG. 4 for nulling the earth's magnetic field in the apparatus of FIG. 1 prior to measuring the magnetic field of a device under test.

The process for nulling the earth's magnetic field performed by the computer 20 in step 56 of FIG. 4 is illustrated in detail in FIG. 5. This process is performed in the absence of the device under test 12. The first step (step 74 of FIG. 5) is to place a probe (such as the probe 14 of FIG. 1) at the center of the turn table 10, which is the origin of the X-Y-Z axes. Then the computer 20 sets an axis index "i" to 1, corresponding for example to the X axis (step 76 of FIG. 5). Then, the probe 14 is aligned parallel to the X axis, either by a servo (not shown in FIG. 1) controlled by the computer 20 or by requesting the operator to align it manually in a message displayed by the computer 20 on the monitor 48. Once the computer 20 is informed that the probe is aligned as desired, the computer 20 samples the magnetic probe output through the interface electronics 24 (step 78 of FIG. 5). The computer deduces the X axis component of the earth's magnetic field from the sampled probe output and from this computes the amount of current required in the X axis Helmholtz coils 40a, 40b to null the measured field (step 80 of FIG. 5). The computer 20 then causes the interface electronics 24 to apply the required current to the X axis Helmholtz coils 40a 40b (step 82). The probe 14 is again sampled (step 84) and if the X-axis field component amplitude is below a predetermined threshold (YES branch of step 86), then the index i is incremented by 1 (step 88), so that i=2 corresponding to the Y axis, and the process returns to step 80 to repeat the foregoing steps for the Y axis. This includes re-aligning the probe 14 from the X axis to the Y axis. Otherwise (NO branch of step 86) the foregoing steps are repeated for the X axis until the proper estimate of the required null current for the X axis Helmholtz coil and the X-axis field component is reduced below the predetermined threshold, before proceeding to the Y axis. The foregoing process is repeated a second time for the Z axis (for which the index i3=3), requiring that the probe 14 be re-aligned from the Y axis to the Z axis. After the field components of all three axes have been measured nulled (YES branch of step 90), the process of nulling the earth's field is finished.

Figure 6:
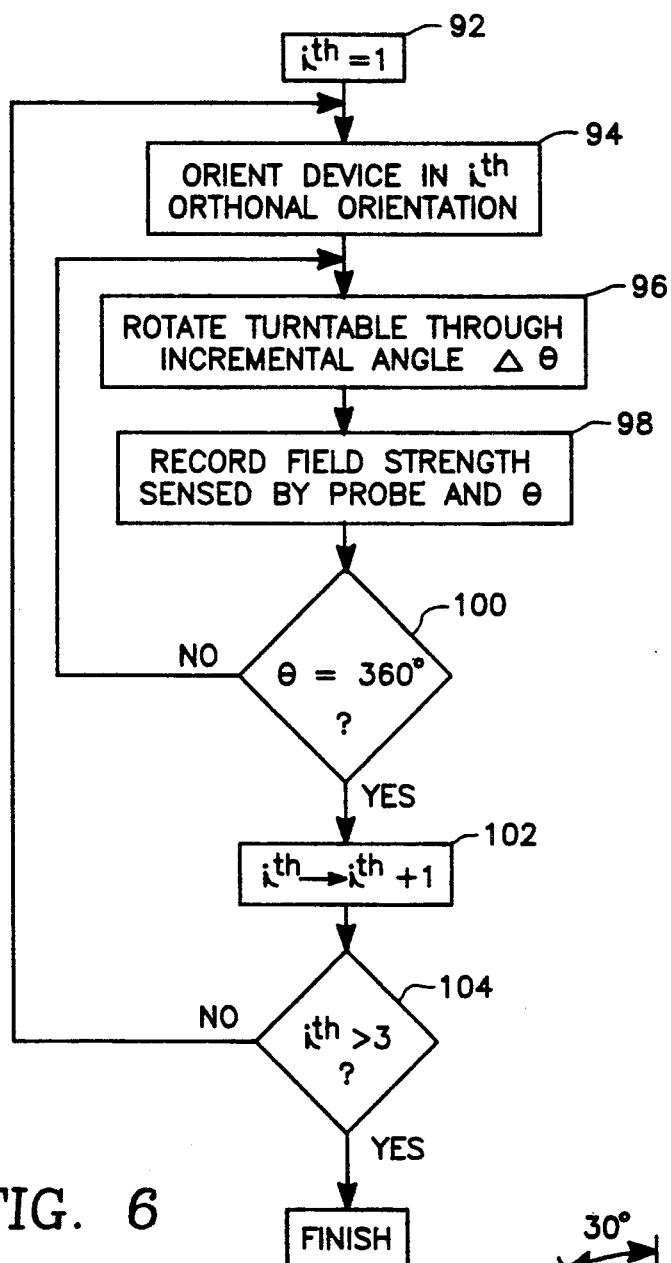
FIG. 6 is a flow diagram of another aspect of the computer operation of FIG. 1 for performing magnetic field mapping of the device under test.

FIG. 6 illustrates in detail the process of magnetic mapping performed by the computer 20 in step 64 of FIG. 4. In preparation for performing this process, the probe 14 must be removed from the center of the turn table 10 and placed to one side of the table 10 in the location illustrated in FIG. 1. Then, the computer 20 sets an index i=1 (step 92 of FIG. 6). The computer 20 then has the device under test 12 placed on the center of the turn table 10 in a first orthogonal orientation (i.e., with the device face 31 facing "up" along the Z axis). This is accomplished either by a servo (not shown) controlled by the computer 20 or by a requested to the operator displayed by the computer 20 on the monitor 48 (step 94 of FIG. 6). The computer 20 then commands the driver 22 to rotate the turn table 10. For each rotation of the table 10 through a predetermined incremental angle $\Delta\theta$ (step 96), the computer 20 samples the output of the magnetic probe 14 through the interface electronics 24 and stores the probe output amplitude in the memory 20a (step 98). The computer 20 then interrogates the output of the optical shaft encoder 26 through the interface electronics 24 to determine the total angle $\theta$ through which the table 10 has rotated. If this amount is less than 360 degrees (NO branch of step 100), then the computer returns to step 96 and keeps repeating the intervening steps until the table 10 has rotated 360 degrees. Once the table 10 has rotated by 360 degrees (YES branch of step 100), the computer increments the index i so that i=2 (corresponding to the Y axis) and returns to step 94. This time, step 94 is performed by facing the next face 32 of the device under test 12 upward along the Z axis. The remaining steps are then performed as before. Then, the index i is incremented to i=3 corresponding to the Z axis (step 102), and the same steps are repeated for the Z axis in the same manner. After the magnetic field components have been characterized for all three axes (YES branch of step 104), the magnetic mapping process of FIG. 6 is finished.

Figure 7:
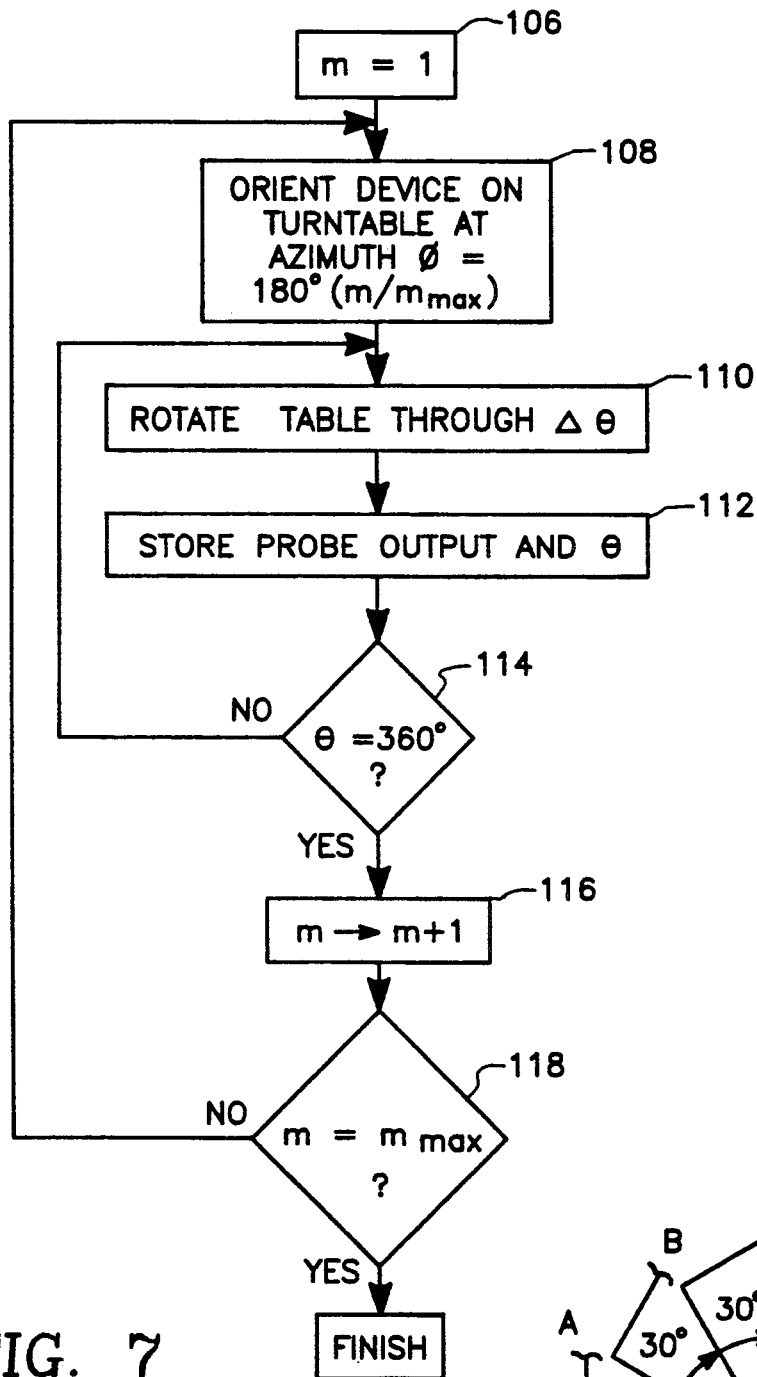
FIG. 7 is a flow diagram of a further aspect of the computer operation of FIG. 4 for performing near field measurements of the device under test using the apparatus of FIG. 1.

FIG. 7 illustrates in detail the more accurate near field measurement process performed by the computer 20 in step 62 of FIG. 4. The position of the probe 14 is as shown in FIG. 1. The computer 20 sets an azimuth index m=1 (step 106 of FIG. 7). In step 108, the device under test 12 is first oriented on the turn table 10 at an orientation corresponding to the position A of FIG. 3, which corresponds to an azimuth angle $\phi=0$ or azimuth index m=1. The computer 20 then rotates the table 10 and for each incremental rotation through an angle $\Delta\theta$ (step 110) samples and records the output of the probe 14 (step 112). This process is repeated until the table 10 has rotated through 360 degrees (YES branch of step 114). Then, the azimuth index m is incremented (step 116) and, provided m is not greater than $m_{max}$ (NO branch of step 118), the device under test 12 is re-oriented (in step 108) by rotating it about the Y axis by an angle $\Delta\theta=180/m_{max}$ to the next position (position B of FIG. 3). The measurements of steps 110 through 114 are then repeated. The foregoing process is repeated until all values of the azimuth index m (up to and including $m_{max}$) for the positions C through F of FIG. 3 have been characterized (YES branch of step 118).

Step 68 of computing the magnetic field of the device under test from the magnetic mapping data produced by the magnetic mapping process of FIG. 6 is performed by the computer 20. The computer 20 simply determines from each of the three profiles of the magnetic sensor output (corresponding to the three orthogonal orientations of the device) the angle at which the maximum magnetic probe output was obtained, for a total of three angles (one for each orthogonal orientation). For each of the three angles, the computer 20 stores the magnitude of the corresponding magnetic probe output and determines the corresponding magnetic field strength. By treating these three angles as Euler angles, the computer 20 uses straightforward spherical trigonometry to compute the field strength components along the X, Y and Z axes of the device 12 for a given device orientation (e.g., where the device face 31 faces "up" along the Z axis of FIG. 1.

In the preferred embodiment, the computer 20 determines from the X, Y and Z components of the measured device field the field strength and orientation of a permanent magnet to be mounted on the device under test 12 so as to nullify the magnetic field of the device under test.

Figure 3:
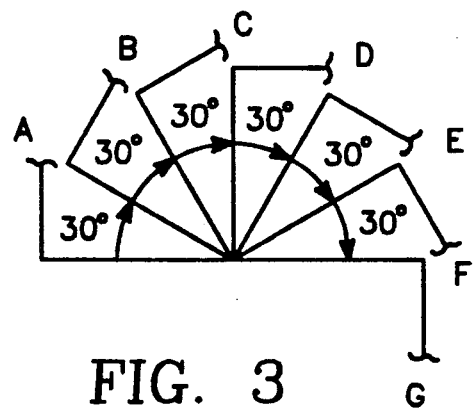
FIG. 3 is a graph of all of the successive positions to which the device under test in FIG. 2 must be moved in one embodiment of the invention.

Step 66 of computing the device magnetic field from the near field measurement data produced in the near field measurement process of FIG. 7 employs a unique application of Maxwell's equations. Specifically, the computer uses the near field test data taken for each value of the azimuth index m to solve the matrix equation (9) of Appendix A hereof. The angle $\phi$ of FIG. 1 is the angle $\phi$ of equation (3) of Appendix A. The azimuth index m of FIG. 7 is the index m of equation (3) of Appendix A. In the preferred embodiment, the azimuth index m assumes the values 1, 2, 3, 4, 5 and 6 so that the rotations of FIG. 3 are performed at 30 degree intervals, thus providing magnetic measurements in six great circles. All of magnetic field strengths deduced from the six rotations performed in the near field measurements process of FIG. 7 are substituted appropriately into the matrix equation (9) of Appendix A by the computer 20. The computer 20 solves for the tensor quantities $A_1^1$, $B_1^1$, $A_1^0$ of the matrix equation (9) of Appendix A, which are the magnetic dipole moments of the device under test 12 along the X, Y and Z axes, respectively. From this, the computer 20 determines the radial and angular components $H_r$ and $H_\theta$ of the device magnetic field as $H_r = 2\,M\,r^{-3}\cos\theta$ and $H_\theta = M\,r^{-2}\sin\theta$, where r is the distance from the dipole to the point at which it is measured, M is the magnitude (absolute value) of the dipole moment vector and $\theta$ is the angle between the dipole moment vector and the radius vector r between the dipole moment and the point of measurement, in accordance with well-known principles. From this, the computer 20 determines in straightforward manner the field strength and orientation of the permanent magnet to be attached to the device under test to nullify its magnetic field at a predetermined distance.

Industrial Applicability

The invention is useful in assembling exploratory vehicles such as spacecraft having a highly sensitive on-board magnetic sensor with magnetic-free components whose magnetic fields have been nulled by first characterizing the magnetic field of each component thereof so as to not affect the on-board sensor.

While the invention has been described in detail by specific reference to preferred embodiments thereof, it is understood that variations and modifications thereof may be made without departing from the true spirit and scope of the invention.

Appendix A

Copyright 1990

Nearfield Analysis Theory

Before the data is submitted to the analysis it is adjusted for three things First, offsets which occur between curves due to external fields or test equipment adjustment are removed. Since the values at the poles should be equal on all six traces, each curve is adjusted by the average difference between the north and south poles of all six traces. Thus the values at the poles on all six traces are made approximately equal. Second, the average value of all data points is subtracted from every data point. This is because the divergence of the field over the spherical surface is zero (Maxwell). Third, each data point is weighted according to the relative spherical surface area which it represents. Points near the poles are closer together and represent less area in the upcoming surface integration.

The analysis itself is based on Maxwell's Second Law, which states that the curl of a magnetic field on a closed surface is zero. Thus the field outside the measurement sphere can be expressed as a scalar potential that is a solution of Laplace's equation.

$$\nabla^2 \Phi = \frac{\partial^2 \Phi}{\partial r^2} + \frac{2}{r} \frac{\partial \Phi}{\partial r} + \frac{1}{r^2} \frac{\partial^2 \Phi}{\partial \theta^2} + \frac{\cot\theta}{r^2} \frac{\partial \Phi}{\partial \theta} + \frac{1}{r^2 \sin^2\theta} \frac{\partial^2 \Phi}{\partial \phi^2} = 0 \quad (1)$$

$$\Phi(\theta,\phi) = \sum_{n=1}^{\infty} \frac{1}{r^{n+1}} \sum_{m=0}^{n} [A_n^m \cos m\phi + B_n^m \sin m\phi] P_n^m(\cos\theta) \quad (2)$$

$$B_r = -\frac{\partial \Phi}{\partial r} = \sum_{n=1}^{\infty} \frac{1}{r^{n+2}} \sum_{m=0}^{n} [A_n^m \cos m\phi + B_n^m \sin m\phi] P_n^m(\cos\theta) \quad (3)$$

where,
$\phi$ is the magnetic scalar potential $B_r$ is the radial magnetic field (calculated)
r is the radius of the measurement sphere (probe distance)
$\theta$ is the table angle (point)
$\phi$ is the tilt angle (curve)
$P_n^m$ is the Schmidt function of degree n and order m (scaled associated Legendre functions)
n is the degree of the spherical harmonic term
m is the order of the spherical harmonic term
$A_n^m$ and $B_n^m$ are the spherical harmonic coefficients (multipole moments)

With the experience obtained through the years at JPL, it has been determined that the highest practical degree of moment needed is n=5. It has also been found that the number of curves (NC) required to achieve an accurate measurement is six. The number of points per trace (NP) to be used in the analysis is selected by the operator at the time of analysis. With these quantities, equation (3) can be represented for each point as a summation of 35 terms.

$$B_{ri} = C_{i,1}A_1^0 + C_{i,2}A_1^1 + C_{i,3}B_1^1 + C_{i,4}A_2^0 + C_{i,5}A_2^1 + C_{i,6}B_2^1 + \ldots + C_{i,35}B_5^5$$

$$B_{ri} = C_{i,1}A_1 + C_{i,2}A_2 + C_{i,3}A_3 + \ldots + C_{i,35}A_{35} \quad (4)$$

When shown for all data points equation (4) becomes:

$$B_r = \sum_{i=1}^{N} \sum_{j=1}^{35} C_{i,j}A_j \quad (5)$$

where
$A_i$ are the unknowns $A_m^n$ and $B_m^n$ $C_{i,j}$ are the normalized trigonometric coefficients, obtained by substituting r, $\theta$, and $\phi$ for each data point into equation (3)
N is the total number of points (NC*NP)

The error between the calculated and measured value is given $$e_i = \sum_{j=1}^{35} (c_{i,j}A_i - B_{ri}) \quad (6)$$

$$\sum_{i=1}^{N} e_i = \sum_{i=1}^{N} \sum_{j=1}^{35} (c_{i,j}A_i - B_{ri}) \quad (7)$$

To minimize the amount of error to find the least squared best fit to equation (7).

$$\sum_{i=1}^{N} e_i^2 = \sum_{i=1}^{N} \sum_{j=1}^{35} (c_{i,j}A_i - B_{ri})^2 \quad (8)$$

If equation (8) is differentiated to find local minima and then expanded and expressed in matrix form:

$$
\begin{aligned}
(\Sigma c_{i,1}^2)A_1 + (\Sigma c_{i,1}c_{i,2})A_2 + \ldots + (\Sigma c_{i,1}c_{i,35})A_{35} &= \Sigma c_{i,1}B_{ri} \\
(\Sigma c_{i,2}c_{i,1})A_1 + (\Sigma c_{i,2}^2)A_2 + \ldots + (\Sigma c_{i,2}c_{i,35})A_{35} &= \Sigma c_{i,1}B_{ri} \\
\vdots \\
(\Sigma c_{i,35}c_{i,1})A_{35} + (\Sigma c_{i,35}c_{i,2})A_2 + \ldots + (\Sigma c_{i,35}^2)A_{25} &= \Sigma C_{i,35}B_{ri}
\end{aligned} \quad (9)
$$

$$(cc')A = cB_r$$

If the c matrix is inverted the unknowns can be found.

$$A = (cB) \times (cc')^{-1}$$

$$A = (cB) * (cc') \quad (10)$$

The multipole moments can be extracted from these unknowns as follows:
monopole moment:
$A_0^0 = 0$
dipole moment:
$A_1^1 = D_x$
$B_1^1 = D_y$
$A_1^0 = D_z$
quadrupole moment:
$Q_{11} = 3^{\frac{1}{2}} A_2^2 - A_2^0$
$Q_{22} = -3^{\frac{1}{2}} A_2^2 - A_2^0$
$Q_{33} = 2 A_2^0$
$Q_{12} = 3^{\frac{1}{2}} A_2^2$
$Q_{13} = 3^{\frac{1}{2}} A_2^1$
$Q_{23} = 3^{\frac{1}{2}} B_2^1$ Coding of Important Functions datgen: averages and equates poles
ggen: calculates area weighting factors
pnm: calculates associated Legendre functions, given: n, m, and $\cos\theta$; uses mathematical definition - differentiates $\cos^2\theta - 1$
spnm: scales associated Legendre functions to obtain Schmidt polynomials
smfcn: calculates normalized trigonometric coefficients
regan: calculates Schmidt coefficients from equation (9b), uses matrix inversion
crintm: calculates dipole and quadrupole moments from Schmidt coefficients senfld: calculates field at alternate coordinates due to earlier calculated multipole moments

Smoothing

Transient noise appears superimposed on top of the true measured data waveforms. This noise is a result of 60 Hz wiring in the vicinity, movement of metal objects. variations in the earth's field, etc. The Schonstedt magnetometer has two rear panel controls which enables internal filters. The first is a power line filter to keep 120v AC noise from reaching the data. It should always be kept ON. The second filters the probe readings. and is adjustable to 10 Hz, 100 Hz, or 1 kHz. This knob should be kept on 10 Hz to attenuate as much noise as possible.

The rest of the unwanted noise which passes through these filters can be attenuated with software. This software smoothing is best understood when considered in the frequency (f) domain. The noise which is filtered out is of a high frequency, but the true data is usually low frequency. Thus, a low-pass filter, chosen with the correct cutoff frequency ($f_O$), will eliminate the unwanted noise, leaving the desired data.

In signal processing, the data waveform is convoluted with a window function $\{w(f)\}$ to perform this filtering. Windows with sharp edges produce unwanted "sinc" sidelobes during convolution (Gibbs effect). The best window to minimize this phenomenon is the Blackman Window, defined as:

$$w(f) = 0.42 + 0.5 * \cos(\pi * f/f_o) + 0.08 * \cos(2\pi * f/f_o)$$

The cutoff frequency is chosen differently, depending on where the smoothing is requested. If you are preparing data for input to nearfield analysis:

$$f_0 = \frac{\text{Number of Points per Input Curve}}{360} \text{ cycles/point}$$

At any other time, such as during a test, or while examining:

$$f_o = 10/360 = 0.2778 \text{ (cycles/point)}$$

Maximum Radial Zero-to-Peak Field

Maximum radial zero-to-peak field at one meter is calculated during analysis of magnetic mapping datafiles. It can only be computed if all three rotations were performed at the same probe distance. The algorithm used:

$$B_r = r^{-3} * [\frac{1}{4} * (B_x^2 + B_y^2 + B_z^2)]^{\frac{1}{2}}$$

where,
- $B_r$ is the maximum radial zero-to-peak field computed at one meter (nT)
- r is the probe distance (m)
- $B_x$, $B_y$, $B_z$ are the maximum peak-to-peak fields of each rotation (nT)
- example) A magnetic mapping is performed at 1 m. The pk-pk fields for all three axes are measured to be 25 nT. The resultant field at 1 m is calculated to be 15.31 nT.

Derivation of DUT Coordinates

The DUT coordinates specify where, in XYZ spacecraft coordinates, the center of the DUT is located. The values are reported in meters and are defined by the spacecraft project. The system only uses them mathematically when conducting nearfield analysis.

Derivation of DUT Angles

The angles which associate the fixed spacecraft coordinate system ($X_{s/c}$, $Y_{s/c}$, $Z_{s/c}$) to the DUT measurement coordinate system ($X_D, Y_D, Z_D$) are termed Z-Y-Z Euler angles. The procedure for obtaining these angles ($\alpha, \beta, \Gamma$) is listed below:

1. Begin with the two frames coincident.
2. Rotate the DUT frame clockwise, (as seen from the spacecraft coordinate origin), about the $Z_{s/c}$ axis by an angle $\alpha$.
3. Rotate the DUT frame clockwise about the $Y_{s/c}$ axis by an angle $\beta$.
4. Rotate the DUT frame clockwise about the $Z_{s/c}$ axis by an angle $\Gamma$.
5. The DUT coordinate system is now oriented in its measurement position.

Units of Magnetic Field Strength

A magnetic field surrounds a magnetic source. Its strength is measured in units of nanoTesla (nT). A nanoTesla is also frequently called a gamma. Another common unit of field strength is the Gauss (G), which is also called the Oersted The relationships between these units are given in Table E-1.

TABLE E-1

| Field | Magnetic Field Conversion Factors | | |
|---|---|---|---|
| | Equivalent field in units of: | | |
| | nanoTesla | Gauss | Tesla |
| 1 nanoTesla (gamma) | 1 | $10^{-5}$ | $10^{-9}$ |
| 1 Gauss (Oersted) | $10^5$ | 1 | $10^{-4}$ |
| 1 Tesla | $10^9$ | $10^4$ | 1 |

Units of Magnetic Moments

A magnetic moment is a measure of the strength of a magnetic source. Its value is independent of reference frame. The chief unit which is used is "Gauss centimeter cubed" ($G*cm^3$), also called the "pole centimeter" (pole*cm) Other units are "Ampere meter squared" ($A*m^2$), and "Weber meter" ($Wb*m$). Conversion factors for these units are listed, in Table E-2.

TABLE E-2

| Moment | Magnetic Moments Conversion Table | | | |
|---|---|---|---|---|
| | Equivalent moment in units of: | | | |
| | $G * cm^3$ | $nT * m^3$ | $A * m^2$ | $Wb * m$ |
| 1 $G * cm^3$ (pole * cm) | 1 | 0.1 | $10^{-3}$ | $1.26 \times 10^{-9}$ |
| 1 $nT * m^3$ | 10 | 1 | $10^{-2}$ | $1.26 \times 10^{-8}$ |
| 1 $A * m^2$ | $10^3$ | $10^2$ | 1 | $1.26 \times 10^{-6}$ |
| 1 $Wb * m$ | $7.94 \times 10^8$ | $7.94 \times 10^7$ | $7.94 \times 10^5$ | 1 |

Relating Magnetic Fields and Moments

The relationship between a magnetic moment and the field which surrounds it will vary depending on the type of source. Simple dipoles, multipoles, long wires, Helmholtz coils, etc all have different relationships. They are too complex to describe in detail here.

The relationship between a pure dipole moment and its magnetic field is given by:

$$H_r = 2 M r^{-3} \cos\theta$$

$$H_\theta = M\, r^{-2} \sin\theta$$

where, $H_r$ is the component of the magnetic field which is directed along r (Gauss)

$H_{74}$ is the component of magnetic field which is perpendicular to the radial magnetic field, and in the plane of M (Gauss)

r magnitude of the vector r between the dipole moment and the point where the field is measured (meters)

M magnitude of the dipole moment vector M ($G^*cm^3$)

$\theta$ is the angle between M and r.

At a distance of 1 m, a dipole that is aligned with the DUT X-axis, with strength 500 $G^*cm^3$, has a peak radial field of $10^{-3}$ Gauss, or 100 nT.

What is claimed is:

1. A method for characterizing the magnetic field of a device under test, comprising:
   nullifying the ambient magnetic field in a test environment area, said nullifying comprising:
   (a) measuring and retrievably storing three orthogonal components of the ambient magnetic field strength in said test environment area,
   (b) computing in processor means a requisite current to be provided in respective orthonal Helmholtz coils for nullifying the corresponding orthogonal magnetic field strength components, and
   (c) maintaining a constant current equal to said requisite current in each respective Helmholtz coil whereby to nullify said ambient field so as to refrain from changing said constant current while performing subsequent sensing steps:
   placing the device under test in the test environment area;
   rotating the device under test in the test environment area at least nearly through a complete circle;
   sensing and recording the magnetic field at a sensor location which is along the circumference of rotation of the device as a function of the angle of rotation of the device;
   re-orienting the device to a successive one of a set of predetermined orientations and repeating said rotating and sensing steps, so as to obtain a profile of the magnetic field at said sensor location as a function of the angle of rotation of the device for each one of said set of predetermined orientations of said device under test;
   characterizing the magnetic field of said device from the magnetic field profiles obtained for said set of orientations.

2. The method of claim 1 wherein said set of orientation comprise three orthogonal orientations of said device.

3. The method of claim 1 wherein said set of orientations comprise a set of m rotations of said device about an axis normal to the axis abut which said rotating step rotates said device, where by to provide magnetic field profiles of said device along m great 4. The method of claim 3 wherein said characterizing step comprises solving Laplace's equation for a magnetic potential along said m great circles simultaneously.

5. The method of claim 1 further comprising the following steps for nullifying the magnetic field of said device under test:
   determining from said characterizing step the field strength and particular orientation of a permanent magnet to be attached to said device so as to nullify the magnetic field of said device; and
   attaching a permanent magnet having said field strength to said device in accordance with said particular orientation.

6. The method of claim 4 wherein said solving comprises solving Laplace's equation with Legendre polynomials whereby to obtain the magnetic quadrapole moment of said device under test.

7. A method of assembling an exploratory vehicle having an on-board magnetic field sensor whereby individual components of said vehicle introduce virtually no magnetic fields to said on-board magnetic field sensor, said method comprising the following steps carried out for each one of said components prior to their inclusion in said vehicle:
   nullifying the ambient magnetic field in a test environment area, said nullifying comprising:
   (a) measuring and retrievably storing three orthogonal components of the ambient magnetic field strength in said test environment area,
   (b) computing in processor means a requisite current to be provided in respective orthogonal Helmholtz coils for nullifying the corresponding orthogonal magnetic field strength components, and
   (c) maintaining a constant current equal to said requisite current in each respective Helmholtz coil whereby to nullify said ambient field;
   placing the one component in the test environment area;
   rotating the one component in the test environment area at least nearly through a complete circle;
   sensing and recording the magnetic field at a sensor location which is along the circumference of rotation of the one component as a function of the angle of rotation of the one component;
   re-orienting the one component to a successive one of a set of predetermined orientations and repeating said rotating and sensing steps, so as to obtain a profile of the magnetic field at said sensor location as a function of the angle of rotation of the one component for each one of said set of predetermined orientations of said one component;
   characterizing the magnetic field of said one component from the magnetic field profiles obtained for said set of orientations;
   determining from said characterizing step the field strength and particular orientation of a permanent magnet to be attached to said one component so as to nullify the magnetic field of said one component; and
   attaching a permanent magnet having said field strength to said one component in accordance with said particular orientation, whereby to produce a component for inclusion in said vehicle which at least nearly does not introduce a magnetic field to said on-board sensor.

8. The method of claim 7 wherein said set of orientations comprise three orthogonal orientations of said one component.

9. The method of claim 7 wherein said set of orientations comprise a set of m rotations of said one component about an axis normal to the axis about which said rotating step rotates said one component, where by to provide magnetic field profiles of said one component along m great circles.

10. The method of claim 9 wherein said characterizing step comprises solving Laplace's equation for a magnetic potential along said m great circles simultaneously.

11. The method of claim 7 further comprising the following steps for nullifying the magnetic field of said one component:

determining from said characterizing step the field strength and particular orientation of a permanent magnet to be attached to said one component so as to nullify the magnetic field of said one component; and attaching a permanent magnet having said field strength to said one component in accordance with said particular orientation.

12. The method of claim 10 wherein said solving comprises solving Laplace's equation with Legendre polynomials whereby to obtain the magnetic quadrapole moment of said device under test.

13. Apparatus for characterizing the magnetic field of a device under test, comprising:

means for nullifying the ambient magnetic field in a test environment area, comprising:

(a) a set of three orthogonally oriented Helmholtz coils placed near said test environment area, (b) means for measuring three orthogonal components corresponding to said three Helmholtz coils of the ambient magnetic field strength in said test environment area, (c) means responsive to measurements obtained from said means for measuring for computing a requisite current to be provided in respective orthogonal Helmholtz coils for nullifying the corresponding orthogonal magnetic field strength components, and (d) control means responsive to said means for computing current for maintaining a constant current equal to said requisite current in each respective Helmholtz coil whereby to nullify said ambient field so as to refrain from changing said constant current during subsequent sensing steps;

means for rotating the device under test in the test environment area at least nearly through a complete circle;

means for sensing the magnetic field at a sensor location which is along the circumference of rotation of the device as a function of the angle of rotation to the device for successive ones of a set of predetermined orientations of said device with respect to said means for sensing so as to obtain a profile of the magnetic field at said sensor location as a function of the angle of rotation of the device for each one of said set of predetermined orientations of said device under test;

means for storing the profiles obtained by said means for sensing; and processor means coupled to said means for storing for characterizing the magnetic field of said device from the magnetic field profiles obtained for said set of orientations.

14. The apparatus of claim 13 wherein said set of orientations comprise three orthogonal orientations of said device.

15. The apparatus of claim 13 wherein said set of orientations comprise a set of m rotations of said device about an axis normal to the axis about which said rotating step rotates said device, where by to provide magnetic field profiles of said device along m great circles.

16. The apparatus of claim 15 wherein said processor means comprises means for solving Laplace's equation for a magnetic potential along said m great circles simultaneously.

17. The apparatus of claim 13 further comprising: processor means coupled to said memory for determining from the output of said means for characterizing the field strength, a location and an orientation of a permanent magnet to be attached to said device so as to nullify the magnetic field of said device and means for displaying said field strength, location and orientation of said permanent magnet to be attached.

18. The apparatus of claim 16 wherein said means for solving comprises solving Laplace's equation with Legendre polynomials whereby to obtain the magnetic quadrapole moment of said device under test.

* * * * *